(12) United States Patent
Wu et al.

(10) Patent No.: US 9,666,692 B2
(45) Date of Patent: May 30, 2017

(54) METHOD OF FORMING FINFET GATE OXIDE

(71) Applicant: TAIWAN SEMICONDUCTOR MANUFACTURING CO., LTD., Hsinchu (TW)

(72) Inventors: Cheng-Ta Wu, Shueishang Township (TW); Ting-Chun Wang, Tainan (TW); Yuan-Nien Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,547

(22) Filed: Jul. 31, 2015

(65) Prior Publication Data

US 2017/0033199 A1  Feb. 2, 2017

(51) Int. Cl.
*H01L 29/66* (2006.01)
*H01L 21/02* (2006.01)
*H01L 21/3115* (2006.01)
*H01L 29/78* (2006.01)
*H01L 29/06* (2006.01)
*H01L 21/762* (2006.01)

(52) U.S. Cl.
CPC ...... *H01L 29/66795* (2013.01); *H01L 21/022* (2013.01); *H01L 21/0214* (2013.01); *H01L 21/0217* (2013.01); *H01L 21/02274* (2013.01); *H01L 21/3115* (2013.01); *H01L 21/76224* (2013.01); *H01L 29/0649* (2013.01); *H01L 29/785* (2013.01)

(58) Field of Classification Search
CPC .......... H01L 29/66795; H01L 21/0217; H01L 29/0649; H01L 21/0214; H01L 21/02274; H01L 21/3115; H01L 21/022; H01L 21/76224; H01L 29/785
USPC ........................................................ 257/401
See application file for complete search history.

(56) References Cited

U.S. PATENT DOCUMENTS

2014/0227856 A1\*  8/2014  Park .................. H01L 21/76224
                                                        438/425
2014/0353795 A1\*  12/2014  Tong ................. H01L 21/76224
                                                        257/506

\* cited by examiner

*Primary Examiner* — Fernando L Toledo
*Assistant Examiner* — Adam S Bowen
(74) *Attorney, Agent, or Firm* — Slater Matsil, LLP (57) ABSTRACT

A semiconductor device includes a semiconductor fin, a first silicon nitride based layer, a lining oxide layer, a second silicon nitride based layer and a gate oxide layer. The semiconductor fin has a top surface, a first side surface adjacent to the top surface, and a second side surface which is disposed under and adjacent to the first side surface. The first silicon nitride based layer peripherally encloses the second side surface of the semiconductor fin. The lining oxide layer is disposed conformal to the first silicon nitride based layer. The second silicon nitride based layer is disposed conformal to the lining oxide layer. The gate oxide layer is disposed conformal to the top surface and the first side surface of the semiconductor fin.

20 Claims, 6 Drawing Sheets

METHOD OF FORMING FINFET GATE OXIDE

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, existing FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a FinFET device, during a high temperature anneal process of an isolation oxide layer and a fin recess etching process, a semiconductor fin formed from silicon will suffer silicon consumption, thus resulting in a smaller critical dimension at a top of the semiconductor fin and a poor fin critical dimension uniformity, and degrading performance of the FinFET device. In addition, the semiconductor fin is likely to be damaged by a thermal stress effect and/or a film stress. Furthermore, due to the silicon consumption of the semiconductor fin, a gate oxide layer has poor conformity to the semiconductor fin, and the gate oxide layer has a thinner thickness at a bottom portion of the semiconductor fin, and thus leakage is likely to occur at the bottom portion of the semiconductor fin.

Embodiments of the present disclosure are directed to providing a semiconductor device and a method for manufacturing the semiconductor device, in which a first silicon nitride based layer and a second silicon nitride based layer are respectively formed conformal to a semiconductor fin and a lining oxide layer which is conformal to the first silicon nitride based layer. The second silicon nitride based layer can prevent the semiconductor fin from being consumed during a subsequent high temperature anneal process performed on an isolation layer and a fin recess etching process, such that a critical dimension at a top of the semiconductor fin can be maintained and the critical dimension uniformity of the semiconductor fin can be increased, thereby enhancing performance of the semiconductor device. In addition to the semiconductor fin is not consumed during the high temperature anneal process and the fin recess etching process, the first silicon nitride based layer peripherally enclosing the semiconductor fin eliminates a silicon orientation effect, and the first silicon nitride based layer and the second silicon nitride based layer are converted into a gate oxide layer, such that the gate oxide layer may have good uniformity and conformity, thereby preventing the leakage of the semiconductor device, and further enhancing performance of the semiconductor device. Moreover, the first silicon nitride based layer and the second silicon nitride based layer remain on a bottom portion of the semiconductor fin, and the first silicon nitride based layer and the second silicon nitride based layer have greater structural strength than the lining oxide layer, thereby sustaining the semiconductor fin and resisting thermal stress and/or film stress.

Figure 1:
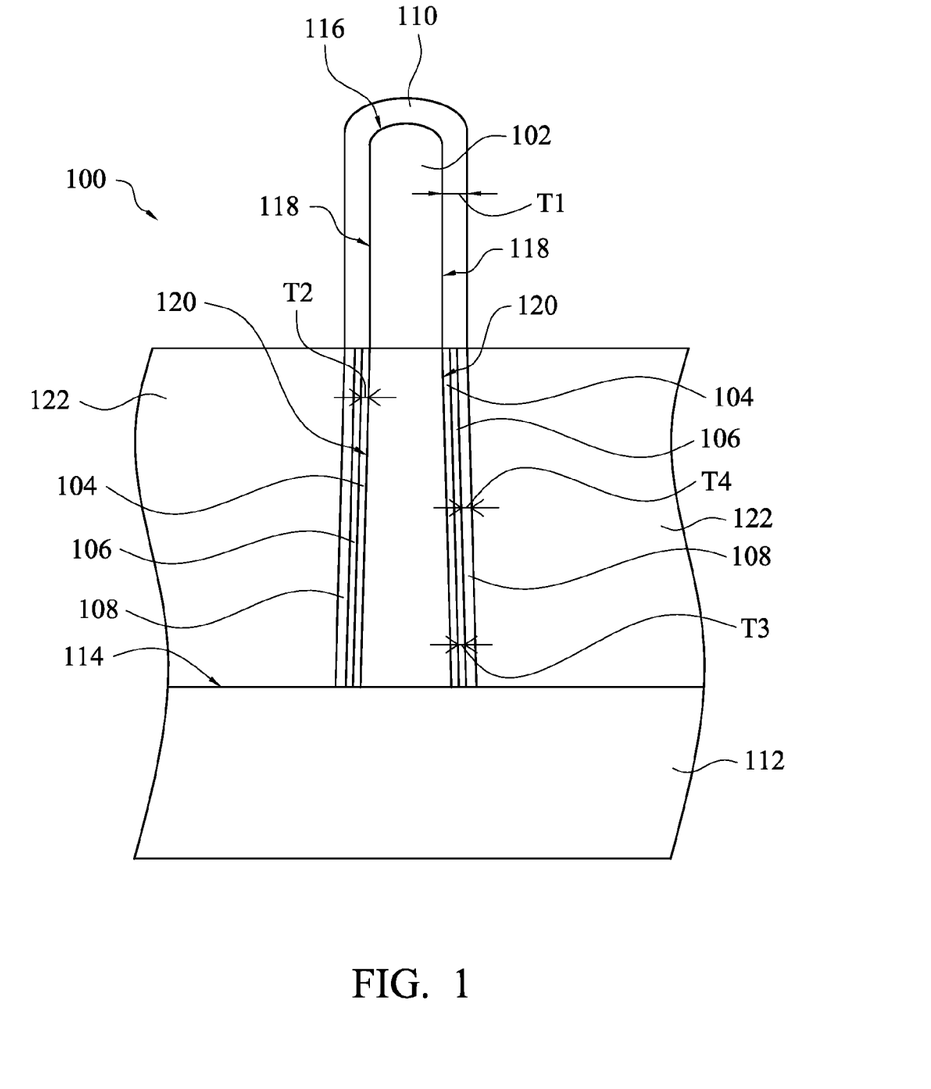
FIG. 1 is a schematic cross-sectional view of a semiconductor device in accordance with various embodiments.

FIG. 1 is a schematic cross-sectional view of a semiconductor device in accordance with various embodiments. In some embodiments, a semiconductor device 100 is a FinFET device. As shown in FIG. 1, the semiconductor device 100 includes a semiconductor fin 102, a first silicon nitride based layer 104, a lining oxide layer 106, a second silicon nitride based layer 108 and a gate oxide layer 110. In some examples, the semiconductor fin 102 is formed by recessing a semiconductor substrate 112, and thus the semiconductor fin 102 protrudes from a recessed surface 114 of the semiconductor substrate 112, and the semiconductor fin 102 and the semiconductor substrate 112 are formed from the same material. The semiconductor substrate 112 and the semiconductor fin 102 may be composed of a single-crystalline semiconductor material or a compound semiconductor material. For example, silicon, germanium or glass may be used as a material of the semiconductor substrate 112 and the semiconductor fin 102. In some exemplary examples, the semiconductor substrate 112 and the semiconductor fin 102 are composed of silicon.

Referring to FIG. 1 again, the semiconductor fin 102 has a top surface 116, a first side surface 118 and a second side surface 120. The top surface 116 is on the top of the semiconductor fin 102. The first side surface 118 is adjacent to and connected to the top surface 116, and peripherally encloses the top surface 116. The second side surface 120 is disposed under the first side surface 118, and is adjacent to and connected to the first side surface 118.

As shown in FIG. 1, the first silicon nitride based layer 104 is disposed on the second side surface 120 of the semiconductor fin 102 to peripherally enclose the second side surface 120. The first silicon nitride based layer 104 may be disposed conformal to the second side surface 120 of the semiconductor fin 102. In some examples, the first silicon nitride based layer 104 includes a silicon nitride layer or a silicon oxynitride layer. In some exemplary examples, the first silicon nitride based layer 104 has a nitrogen concentration ranging from about 1E19 atoms/cm$^3$ to about 5E21 atoms/cm$^3$.

The lining oxide layer 106 is disposed on and conformal to the first silicon nitride based layer 104, and peripherally encloses the first silicon nitride based layer 104. The first silicon nitride based layer 104 is disposed between the second side surface 120 of the semiconductor fin 102 and the lining oxide layer 106. In some examples, the lining oxide layer 106 includes a silicon oxide layer. For example, the lining oxide layer 106 has a thickness ranging from about 20 angstrom to about 60 angstrom.

The second silicon nitride based layer 108 is disposed on and conformal to the lining oxide layer 106, and peripherally encloses the lining oxide layer 106. In some examples, the second silicon nitride based layer 108 includes a silicon nitride layer, a silicon oxynitride layer or a silicon oxycarbonitride layer. In some exemplary examples, the second silicon nitride based layer 108 has a nitrogen concentration ranging from about 1E19 atoms/cm$^3$ to about 5E21 atoms/cm$^3$.

The gate oxide layer 110 is disposed on and conformal to the top surface 116 and the first side surface 118 of the semiconductor fin 102 to peripherally enclose the top surface 116 and the first side surface 118. In some examples, the gate oxide layer 110 includes a silicon oxide layer. In certain examples, the gate oxide layer 108 has a thickness T1 equal to a combination of a thickness T2 of the first silicon nitride based layer 104, a thickness T3 of the lining oxide layer 106 and a thickness T4 of the second silicon nitride based layer 108.

In some examples, as shown in FIG. 1, the semiconductor device 100 further includes various trench isolation structures 122. The trench isolation structures 122 may peripherally enclose the second silicon nitride based layer 108. For example, each of the trench isolation structures 122 may be a shallow trench isolation (STI) structure. In some examples, the trench isolation structures 122 include a dielectric layer, such as a silicon dioxide layer.

With the second silicon nitride based layer 108 formed conformal to the lining oxide layer 106, the semiconductor fin 102 can be prevented from consuming during a high temperature anneal process of the trench isolation structures 122 and a recess etching process of the isolation layer for forming the trench isolation structures 122, such that a critical dimension at the top of the semiconductor fin 102 can be maintained and the critical dimension uniformity of the semiconductor fin 102 can be increased, thereby enhancing performance of the semiconductor device 100. In addition to the semiconductor fin 102 is not consumed during the high temperature anneal process and the fin recess etching process, the first silicon nitride based layer 104 peripherally enclosing the semiconductor fin 102 eliminates a silicon orientation effect, and the first silicon nitride based layer 104 and the second silicon nitride based layer 108 are converted into the gate oxide layer 110, such that the gate oxide layer 110 may have good uniformity and conformity, thereby preventing the leakage of the semiconductor device 100, and further enhancing performance of the semiconductor device 100. Furthermore, the first silicon nitride based layer 104 and the second silicon nitride based layer 108 remains on a bottom portion of the semiconductor fin 102, and the first silicon nitride based layer 104 and the second silicon nitride based layer 108 have greater structural strength than the lining oxide layer 106, such that the first silicon nitride based layer 104 and the second silicon nitride based layer 108 sustain the semiconductor fin 102 and resist thermal stress and/or film stress, thereby increasing the process yield of the semiconductor device 100.

Figure 2A:
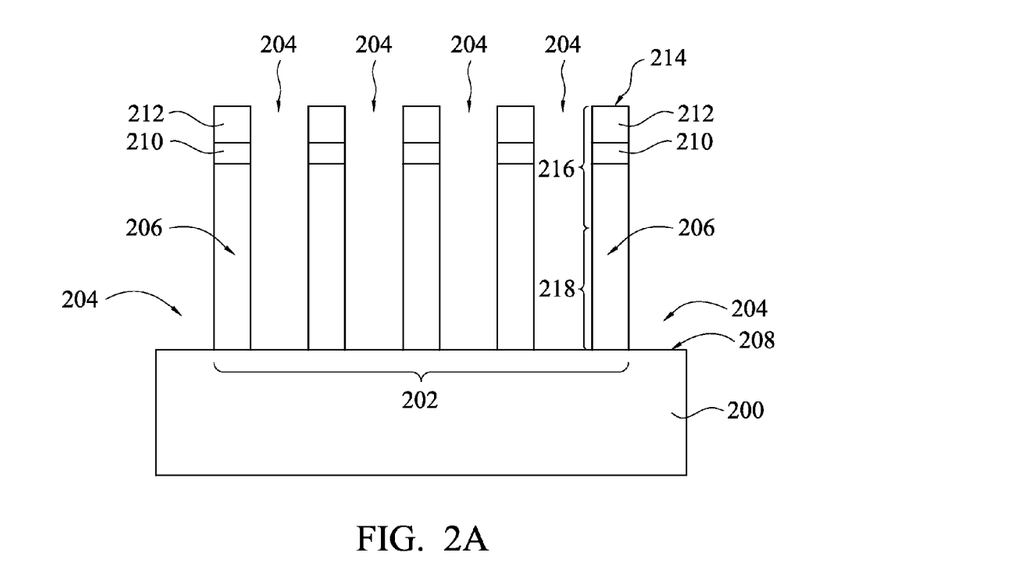
FIG. 2A through FIG. 2G are schematic cross-sectional views of intermediate stages showing a method for manufacturing a semiconductor device in accordance with various embodiments.

FIG. 2A through FIG. 2G are schematic cross-sectional views of intermediate stages showing a method for manufacturing a semiconductor device in accordance with various embodiments. As shown in FIG. 2A, a semiconductor substrate 200 is provided, and the semiconductor substrate 200 is recessed to define an active region 202 in the semiconductor substrate 200. In the operation of recessing the semiconductor substrate 200, a portion of the semiconductor substrate 200 is removed to form various isolation regions 204 in the semiconductor substrate 200 and at least one semiconductor fin 206 between the isolation regions 204 and over top surfaces 208 of the isolation regions 204. In some examples, as shown in FIG. 2A, various semiconductor fins 206 are formed in the operation of recessing the semiconductor substrate 200. In such examples, each of the semiconductor fins 206 is composed of a portion of the semiconductor substrate 200, such that the semiconductor fins 206 are formed from a material the same as that of the semiconductor substrate 200. The semiconductor substrate 200 and the semiconductor fins 206 may be composed of a single-crystalline semiconductor material or a compound semiconductor material. In some examples, silicon, germanium or glass may be used as a material of the semiconductor substrate 200 and the semiconductor fins 206. In some exemplary examples, the semiconductor substrate 200 and the semiconductor fins 206 are formed from silicon.

In certain examples, before the operation of recessing the semiconductor substrate 200, a pad oxide layer 210 and a hard mask layer 212 are blanketly formed on the semiconductor substrate 200 in sequence. For example, the pad oxide layer 210 may be formed using a thermal oxidation technique, and the hard mask layer 212 may be formed using a deposition technique, such as a chemical vapor deposition (CVD) technique. In some exemplary examples, the pad oxide layer 210 is formed to include a silicon oxide layer, and the hard mask layer 212 is formed to include a silicon nitride layer. As shown in FIG. 2A, the operation of recessing the semiconductor substrate 200 includes removing a portion of the hard mask layer 212, a portion of the pad oxide layer 210 and a portion of the semiconductor substrate 200 on the top surfaces 208 of the isolation regions 204. In such examples, each of the semiconductor fins 206 is composed of a portion of the semiconductor substrate 200, a portion of the pad oxide layer 214 and a portion of the hard mask layer 212 which are stacked sequentially.

Referring to FIG. 2A again, each of the semiconductor fins 206 has a top surface 214, a first side surface 216 and a second side surface 218. The top surface 214 is on the top of the semiconductor fin 206. The first side surface 216 is adjacent to and connected to the top surface 214, and peripherally encloses the top surface 214. The second side surface 218 is formed under the first side surface 216, and is adjacent to and connected to the first side surface 216.

Figure 2B:
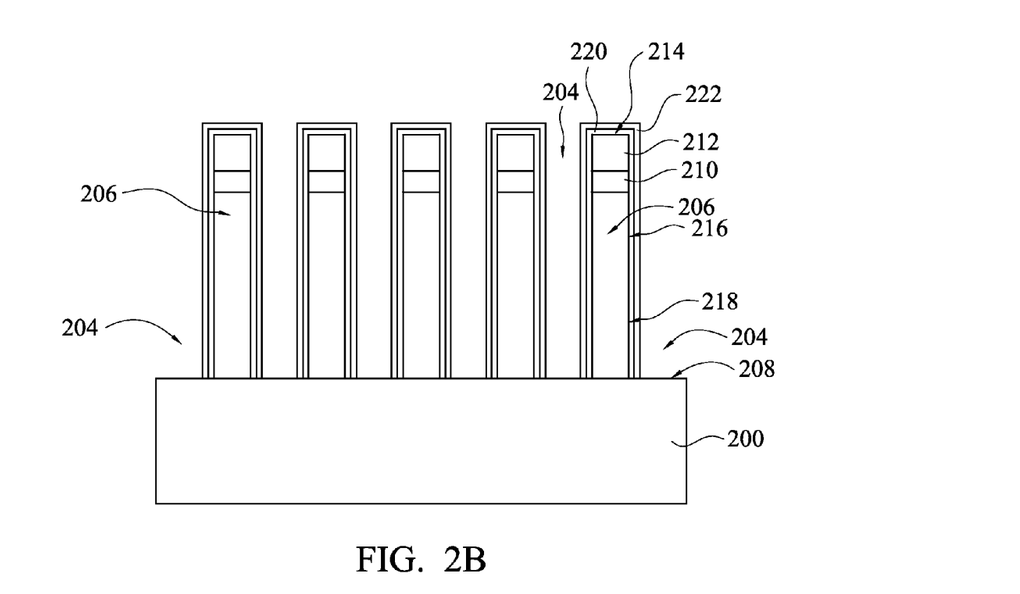

As shown in FIG. 2B, a first silicon nitride based layer 220 is formed on the top surface 214, the first side surface 216 and the second side surface 218 of each semiconductor fin 206 and conformal to each semiconductor fin 206. In some examples, the operation of forming the first silicon nitride based layer 220 includes forming the first silicon nitride based layer 220 from silicon nitride or silicon oxynitride. For example, the operation of forming the first silicon nitride based layer 220 may include forming the first silicon nitride based layer 220 having a nitrogen concentration ranging from about 1E19 atoms/cm$^3$ to about 5E21 atoms/cm$^3$. A lining oxide layer 222 is formed on and conformal to the first silicon nitride based layer 220, and peripherally encloses the first silicon nitride based layer 220 using, for example, a rapid thermal oxidation technique or an in-site steam generation technique. The operation of forming the lining oxide layer 222 may be performed using a deposition technique, such as a chemical vapor deposition technique. In some examples, the lining oxide layer 222 is formed to include a silicon oxide layer.

In some examples, the operation of forming the lining oxide layer 222 is performed before the operation of forming the first silicon nitride based layer 220. In such examples, the lining oxide layer 222 is firstly formed on the top surface 214, the first side surface 216 and the second side surface 218 of each semiconductor fin 206 and conformal to each semiconductor fin 206. For example, the operation of forming the lining oxide layer 222 may include forming the lining oxide layer 222 having a thickness ranging from about 20 angstrom to about 60 angstrom. Then, the first silicon nitride based layer 220 is formed conformal to each semiconductor fin 206 and between the semiconductor fin 206 and the lining oxide layer 222 using, for example, an anneal process. In some exemplary examples, the anneal process performed to form the first silicon nitride based layer 220 includes introducing a reaction gas which includes NO and/or N$_2$O into a process chamber to form the first silicon nitride based layer 220, and controlling a process temperature of the process chamber between about 900 degrees centigrade and about 1050 degrees centigrade. In the anneal process, NO and N$_2$O are dissociated into nitrogen ions and oxygen ions, and the nitrogen ions pass through the lining oxide layer 222 to react with the material of the semiconductor fin 206, so as to form the first silicon nitride based layer 220 between the semiconductor fin 206 and the lining oxide layer 222.

Figure 2C:
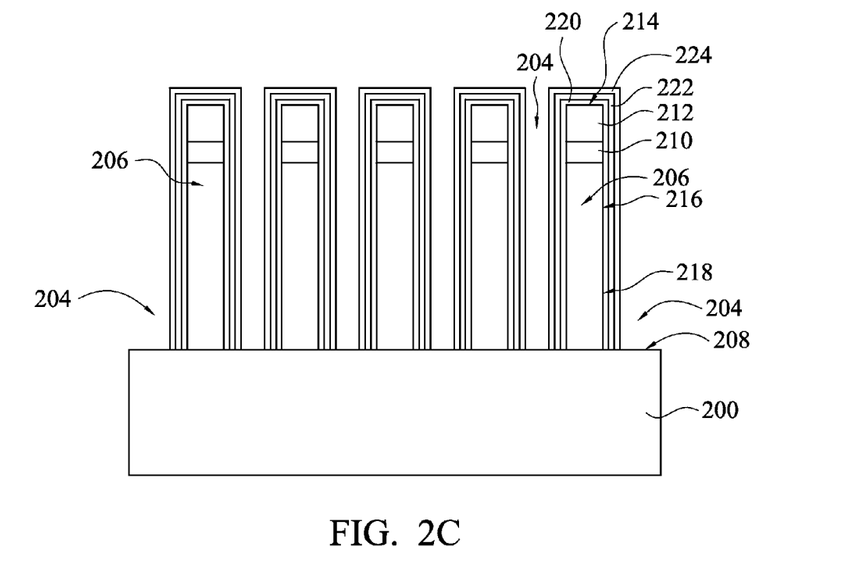

As shown in FIG. 2C, a second silicon nitride based layer 224 is formed on the lining oxide layer 222 of each semiconductor fin 206 and conformal to the lining oxide layer 222. The operation of forming the second silicon nitride based layer 224 may include forming the second silicon nitride based layer 224 from silicon nitride, silicon oxynitride or silicon oxycarbonitride. For example, the operation of forming the second silicon nitride based layer 224 may include forming the second silicon nitride based layer 224 having a nitrogen concentration ranging from about 1E19 atoms/cm$^3$ to about 5E21 atoms/cm$^3$.

In some examples, the operation of forming the second silicon nitride based layer 224 is performed after the operation of forming the first silicon nitride based layer 220 and the operation of forming the lining oxide layer 222. For example, the operation of forming the silicon nitride based layer 222 may be performed using an anneal process. In some exemplary examples, the anneal process performed to form the second silicon nitride based layer 224 includes introducing a reaction gas which includes NH$_3$ into a process chamber to form the second silicon nitride based layer 224, and controlling a process temperature of the process chamber between about 900 degrees centigrade and about 1050 degrees centigrade. In the anneal process, NH$_3$ is dissociated into nitrogen ions and hydrogen ions, and the nitrogen ions react with the lining oxide layer 222, so as to form the second silicon nitride based layer 224 on and conformal to the lining oxide layer 222.

Figure 2D:
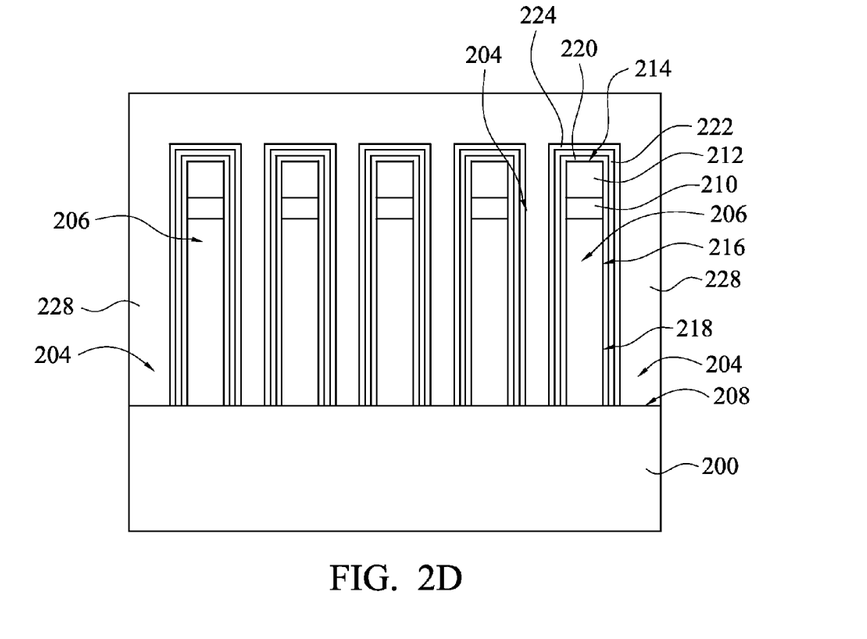
Figure 2E:
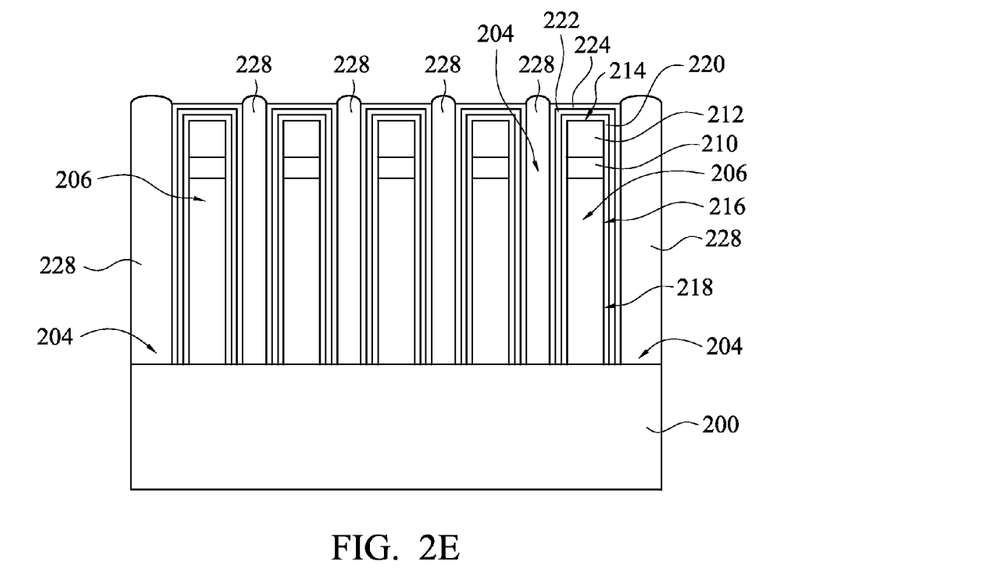
Figure 2F:
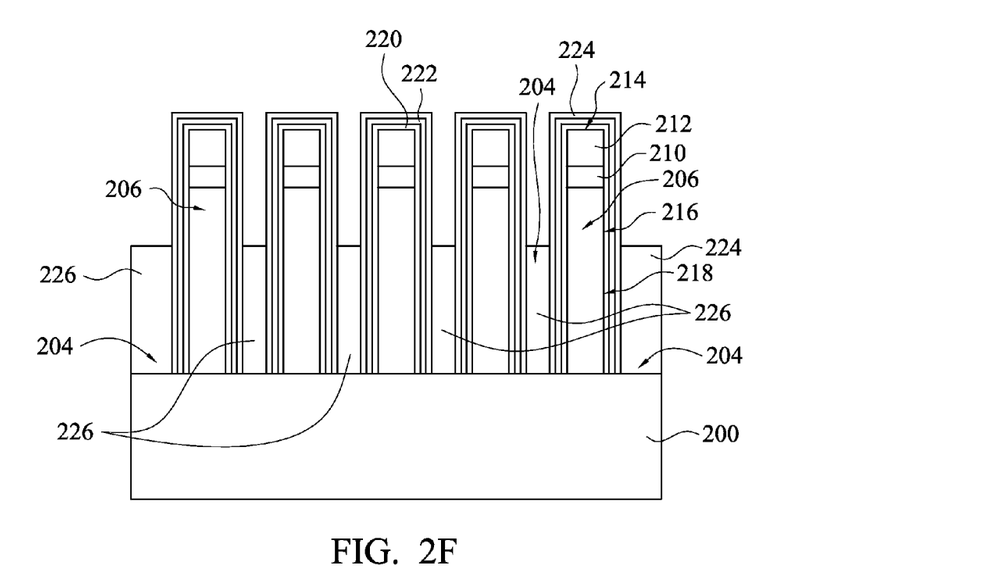

Referring to FIG. 2F firstly, various trench isolation structures 226 are formed on the isolation regions 204 to peripherally enclose the second silicon nitride based layer 224 on the second side surface 218 of each of the semiconductor fins 206. In some examples, as shown in FIG. 2D, the operation of forming the trench isolation structures 226 includes forming an isolation layer 228 to cover the second silicon nitride based layers 224 and to fill the isolation regions 204. The isolation layer 228 is formed to cover the semiconductor fins 206. For example, the operation of forming the isolation layer 228 may be performed using a chemical vapor deposition technique, such as a high-density plasma chemical vapor deposition (HDP-CVD) technique. In some exemplary examples, the isolation layer 228 is formed to include a silicon oxide layer.

After the operation of forming the isolation layer 228, an anneal operation may be optionally performed on the isolation layer 228 to densify the isolation layer 228. With the second silicon nitride based layer 224 disposed conformal to the lining oxide layer 222, the second silicon nitride based layer 224 can prevent each of the semiconductor fins 206 from being consumed during the high temperature anneal operation performed on the isolation layer 228, such that a critical dimension at the top of each of the semiconductor fins 206 can be maintained, thereby increasing the critical dimension uniformity of the semiconductor fins 206.

As shown in FIG. 2E, the isolation layer 228 is planarized to expose the second silicon nitride based layers 224 on the top surfaces 214 of the semiconductor fins 206. For example, the operation of planarizing the isolation layer 228 may be performed using a chemical mechanical polishing (CMP) technique. In some examples, after the operation of planarizing the isolation layer 228, various wells may be optionally formed into the semiconductor substrate 200 using an implanting technique.

As shown in FIG. 2F, the isolation layer 228 is recessed to form the trench isolation structures 226 on the isolation regions 204. The operation of recessing the isolation layer 228 may be performed using an etching technique, such as an anisotropic etching technique. The operation of recessing the isolation layer 228 includes removing a portion of the isolation layer 228 to expose the second silicon nitride based layer 224 on the first side surface 216 of each of the semiconductor fins 206 and to form the trench isolation structures 226 to peripherally enclose the second silicon nitride based layer 224 on the second side surface 218 of each of the semiconductor fins 206.

The second silicon nitride based layer 224 disposed conformal to the lining oxide layer 222 can prevent each of the semiconductor fins 206 from being consumed during the operation of recessing the isolation layer 228, such that the critical dimension at the top of each of the semiconductor fins 206 can be effectively maintained, thereby further increasing the critical dimension uniformity of the semiconductor fins 206.

Figure 2G:
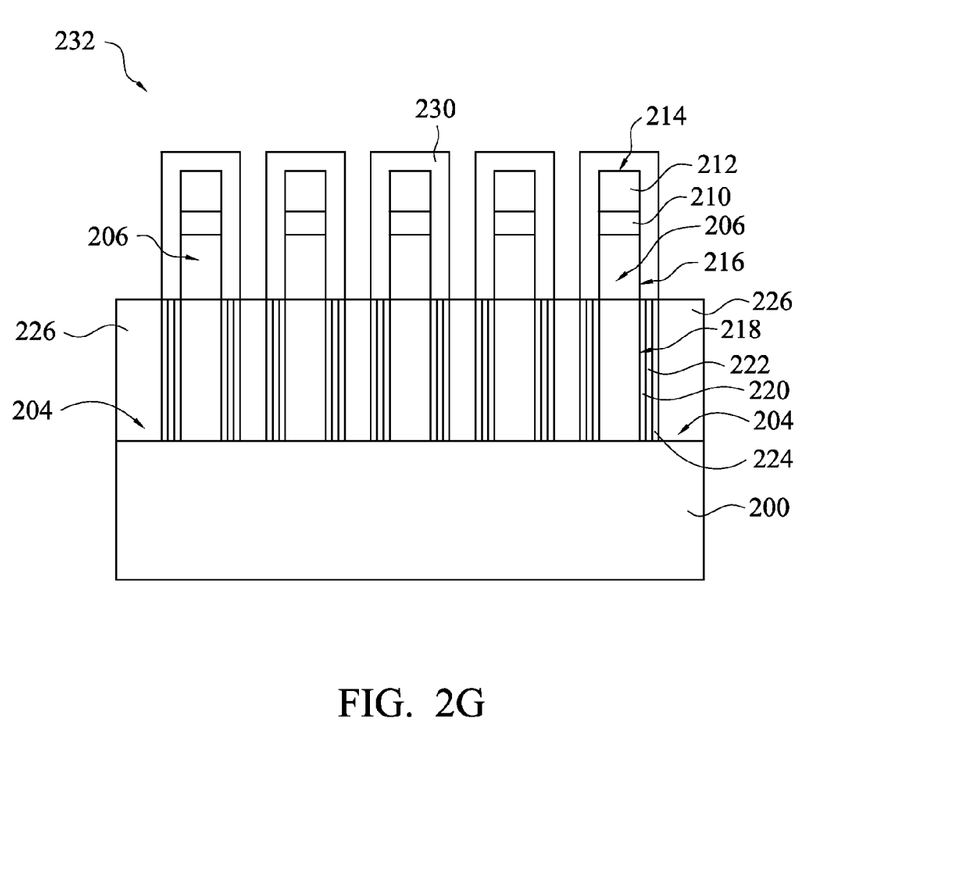

As shown in FIG. 2G, the second silicon nitride based layer 224 and the first silicon nitride based layer 220 on the top surface 214 and the first side surface 216 of each of the semiconductor fins 206 are converted into a gate oxide layer 230 to complete the formation of a semiconductor device 232. In some exemplary examples, the operation of converting the second silicon nitride based layer 224 and the first silicon nitride based layer 220 on the top surface 214 and the first side surface 216 of each semiconductor fin 206 into the gate oxide layer 230 includes converting the second silicon nitride based layer 224 and the first silicon nitride based layer 220 into silicon oxide. In some examples, the operation of converting the second silicon nitride based layer 224 and the first silicon nitride based layer 220 on the top surface 214 and the first side surface 216 of each semiconductor fin 206 into the gate oxide layer 230 includes introducing a reaction gas into the process chamber to form the gate oxide layer 230, in which the reaction gas includes $O_2$ and 0.5 weight percent to 33 weight percent $H_2$. The operation of converting the second silicon nitride based layer 224 and the first silicon nitride based layer 220 may further include controlling a process temperature of the process chamber between about 500 degrees centigrade and about 950 degrees centigrade, and controlling a process pressure of the process chamber between about 2 torr and about 100 torr. The operation of converting the second silicon nitride based layer 224 and the first silicon nitride based layer 220 may be performed by applying radio frequency electromagnetic energy at a microwave frequency to the process chamber.

In the operation of converting the second silicon nitride based layer 224 and the first silicon nitride based layer 220, $O_2$ of the reaction gas is dissociated into monatomic oxygen under the high process temperature, the second silicon nitride based layer 224 and the first silicon nitride based layer 220 on the top surface 214 and the first side surface 216 of each semiconductor fin 206 are re-oxidized by the monatomic oxygen, such that the second silicon nitride based layer 224 and the first silicon nitride based layer 220 are converted into silicon oxide layers. While the second silicon nitride based layer 224 and the first silicon nitride based layer 220 are converted into the silicon oxide layers, the silicon oxide layers are integrated with the lining oxide layer 222 on the top surface 214 and the first side surface 216 of each semiconductor fin 206 to form the gate oxide layer 230 because the materials of all the silicon oxide layers and the lining oxide layer 222 are silicon oxide.

After the operation of converting the second silicon nitride based layer 224 and the first silicon nitride based layer 220 into the gate oxide layer 230, the second silicon nitride based layer 224 and the first silicon nitride based layer 220 remain on a bottom portion of each of the semiconductor fins 206, and the second silicon nitride based layer 224 and the first silicon nitride based layer 220 have greater structural strength than the lining oxide layer 222, such that the semiconductor fin 206 is sustained, thereby resisting thermal stress and/or film stress. Furthermore, the semiconductor fin 206 is not consumed during the high temperature anneal operation and the recessing operation, and the first silicon nitride based layer 220 and the second silicon nitride based layer 224 are converted into the gate oxide layer 230, such that the gate oxide layer 230 may have good uniformity and conformity, thereby preventing the leakage of the semiconductor device 232, and further enhancing performance of the semiconductor device 232.

Figure 3:
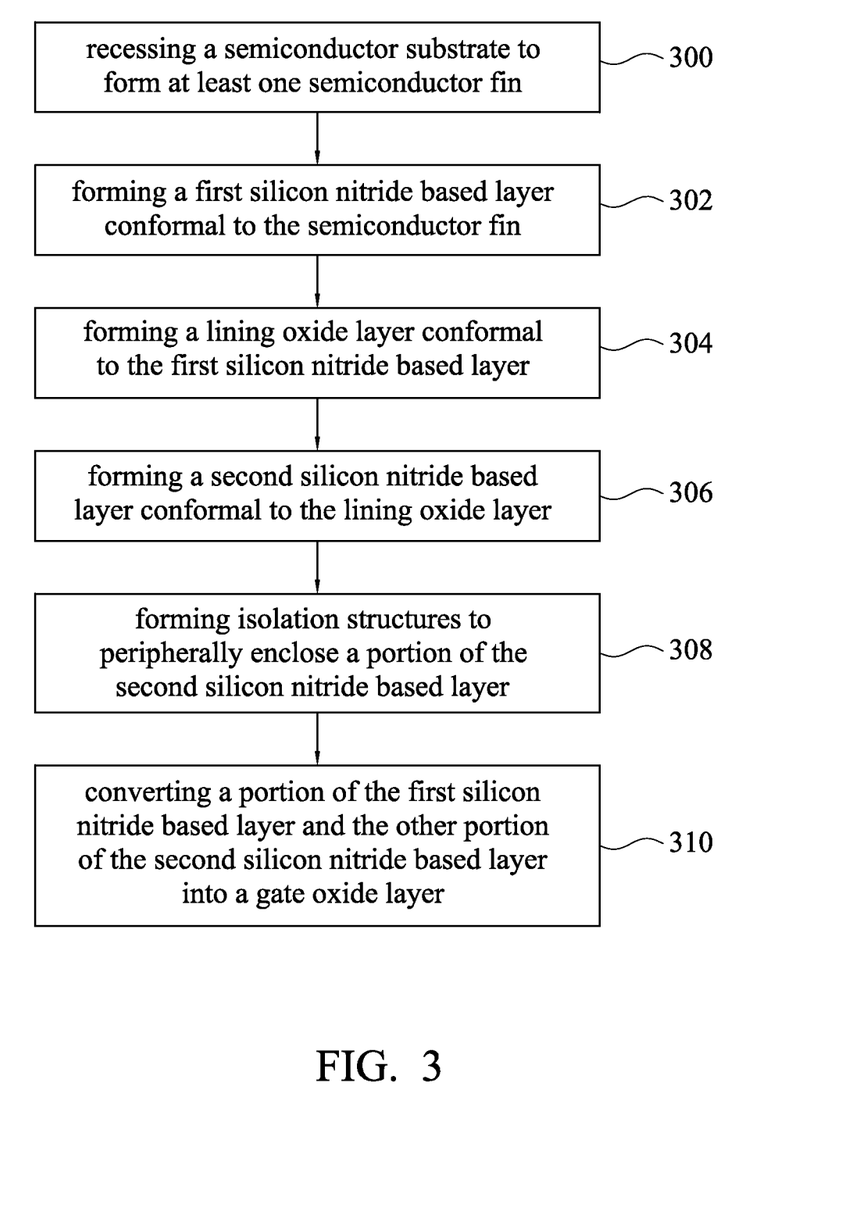
FIG. 3 is a flow chart of a method for manufacturing a semiconductor device in accordance with various embodiments.

Referring to FIG. 3 with FIG. 2A through FIG. 2g, FIG. 3 is a flow chart of a method for manufacturing a semiconductor device in accordance with various embodiments. The method begins at operation 300, where a semiconductor substrate 200 is recessed to define an active region 202 in the semiconductor substrate 200. As shown in FIG. 2A, the operation of recessing the semiconductor substrate 200 includes removing a portion of the semiconductor substrate 200 to form various isolation regions 204 in the semiconductor substrate 200 and at least one semiconductor fin 206 between the isolation regions 204 and over the top surfaces 208 of the isolation regions 204. In the examples shown in FIG. 2A, various semiconductor fins 206 are formed. In the examples, each semiconductor fin 206 is composed of a portion of the semiconductor substrate 200. The semiconductor substrate 200 and the semiconductor fins 206 may be composed of a single-crystalline semiconductor material or a compound semiconductor material. In some exemplary examples, the semiconductor substrate 200 and the semiconductor fins 206 are formed from silicon.

In some exemplary examples, before the operation of recessing the semiconductor substrate 200, a pad oxide layer 210 and a hard mask layer 212 are blanketly formed on the semiconductor substrate 200 in sequence. The pad oxide layer 210 may be formed to include a silicon oxide layer using a thermal oxidation technique, and the hard mask layer 212 may be formed to include a silicon nitride layer using, for example, a chemical vapor deposition technique. As shown in FIG. 2A, the operation of recessing the semiconductor substrate 200 includes removing a portion of the hard mask layer 212, a portion of the pad oxide layer 210 and a portion of the semiconductor substrate 200 on the top surfaces 208 of the isolation regions 204. Thus, each of the semiconductor fins 206 is composed of a portion of the semiconductor substrate 200, a portion of the pad oxide layer 214 and a portion of the hard mask layer 212 which are stacked sequentially.

As shown in FIG. 2A, each of the semiconductor fins 206 has a top surface 214, a first side surface 216 and a second side surface 218. The top surface 214 is on the top of the semiconductor fin 206. The first side surface 216 is adjacent to and connected to the top surface 214 and peripherally encloses the top surface 214. The second side surface 218 is formed under, adjacent to and connected to the first side surface 216.

At operation 302, as shown in FIG. 2B, a first silicon nitride based layer 220 is formed on the top surface 214, the first side surface 216 and the second side surface 218 of each semiconductor fin 206 and conformal to each semiconductor fin 206. In some examples, the operation of forming the first silicon nitride based layer 220 includes forming the first silicon nitride based layer 220 from silicon nitride or silicon oxynitride. For example, the operation of forming the first silicon nitride based layer 220 may include forming the first silicon nitride based layer 220 having a nitrogen concentration ranging from about 1E19 atoms/cm$^3$ to about 5E21 atoms/cm$^3$.

At operation 304, as shown in FIG. 2B, a lining oxide layer 222 is formed on the top surface 214, the first side surface 216 and the second side surface 218 of each semiconductor fin 206 and conformal to each semiconductor fin 206 using, for example, a rapid thermal oxidation technique, an in-site steam generation technique or a deposition technique. In some exemplary examples, the lining oxide layer 222 is formed from silicon oxide.

In some examples, the operation of forming the lining oxide layer 222 is performed before the operation of forming the first silicon nitride based layer 220. In such examples, the lining oxide layer 222 is firstly formed on the top surface 214, the first side surface 216 and the second side surface 218 of each semiconductor fin 206 and conformal to each semiconductor fin 206. For example, the operation of forming the lining oxide layer 222 may include forming the lining oxide layer 222 having a thickness ranging from about 20 angstrom to about 60 angstrom. Then, the first silicon nitride based layer 220 is formed conformal to each semiconductor fin 206 and between the semiconductor fin 206 and the lining oxide layer 222 using, for example, an anneal process. In some exemplary examples, the anneal process performed to form the first silicon nitride based layer 220 includes introducing a reaction gas which includes NO and/or $N_2O$ into a process chamber to form the first silicon nitride based layer 220, and controlling a process temperature of the process chamber between about 900 degrees centigrade and about 1050 degrees centigrade. In the anneal process, NO and $N_2O$ are dissociated into nitrogen ions and oxygen ions, and the nitrogen ions pass through the lining oxide layer 222 to react with the material of the semiconductor fin 206, so as to form the first silicon nitride based layer 220 between the semiconductor fin 206 and the lining oxide layer 222.

At operation 306, as shown in FIG. 2C, a second silicon nitride based layer 224 is formed on the lining oxide layer 222 of each semiconductor fin 206 and conformal to the lining oxide layer 222 using, for example, an anneal process. The operation of forming the second silicon nitride based layer 224 may include forming the second silicon nitride based layer 224 from silicon nitride, silicon oxynitride or silicon oxycarbonitride. For example, the operation of forming the second silicon nitride based layer 224 may include forming the second silicon nitride based layer 224 having a nitrogen concentration ranging from about 1E19 atoms/cm$^3$ to about 5E21 atoms/cm$^3$.

In some exemplary examples, the anneal process performed to form the second silicon nitride based layer 224 includes introducing a reaction gas which includes $NH_3$ into a process chamber to form the second silicon nitride based layer 224, and controlling a process temperature of the process chamber between about 900 degrees centigrade and about 1050 degrees centigrade. In the anneal process, $NH_3$ is dissociated into nitrogen ions and hydrogen ions, and the nitrogen ions react with the lining oxide layer 222, so as to form the second silicon nitride based layer 224 on and conformal to the lining oxide layer 222.

At operation 308, as shown in FIG. 2F, various trench isolation structures 226 are formed on the isolation regions 204 to peripherally enclose the silicon nitride based layer 222 on the second side surface 218 of each of the semiconductor fins 206. In some examples, as shown in FIG. 2D, the operation of forming the trench isolation structures 226 includes forming an isolation layer 228 to cover the second silicon nitride based layers 224 and the semiconductor fins 206 and to fill the isolation regions 204 using, for example, a high-density plasma chemical vapor deposition technique. In some exemplary examples, the isolation layer 228 is formed from silicon oxide.

After the isolation layer 228 is formed, an anneal operation may be optionally performed on the isolation layer 228 to densify the isolation layer 228. As shown in FIG. 2E, the isolation layer 228 is planarized to expose the second silicon nitride based layers 224 on the top surfaces 214 of the semiconductor fins 206 using, for example, a chemical mechanical polishing technique. In some examples, after the operation of planarizing the isolation layer 228, various wells may be optionally formed into the semiconductor substrate 200 using an implanting technique.

As shown in FIG. 2F, the isolation layer 228 is recessed to form the trench isolation structures 226 on the isolation regions 204 using, for example, an anisotropic etching technique. The operation of recessing the isolation layer 228 includes removing a portion of the isolation layer 228 to expose the second silicon nitride based layer 224 on the first side surface 216 of each of the semiconductor fins 206 and to form the trench isolation structures 226 to peripherally enclose the second silicon nitride based layer 224 on the second side surface 218 of each of the semiconductor fins 206.

At operation 310, as shown in FIG. 2G, the second silicon nitride based layer 224 and the first silicon nitride based layer 220 on the top surface 214 and the first side surface 216 of each semiconductor fin 206 are converted into a gate oxide layer 230 to complete the formation of a semiconductor device 232. In some exemplary examples, the operation of converting the second silicon nitride based layer 224 and the first silicon nitride based layer 220 includes converting the second silicon nitride based layer 224 and the first silicon nitride based layer 220 into silicon oxide. In some examples, the operation of converting the second silicon nitride based layer 224 and the first silicon nitride based layer 220 on the top surface 214 and the first side surface 216 of each semiconductor fin 206 includes introducing a reaction gas into the process chamber to form the gate oxide layer 230, in which the reaction gas includes $O_2$ and 0.5 weight percent to 33 weight percent $H_2$. The operation of converting the second silicon nitride based layer 224 and the first silicon nitride based layer 220 may further include controlling a process temperature of the process chamber between about 500 degrees centigrade and about 950 degrees centigrade, and controlling a process pressure of the process chamber between about 2 torr and about 100 torr. The operation of converting the second silicon nitride based layer 224 and the first silicon nitride based layer 220 may be performed by applying radio frequency electromagnetic energy at a microwave frequency to the process chamber.

In the operation of converting the second silicon nitride based layer 224 and the first silicon nitride based layer 220, $O_2$ of the reaction gas is dissociated into monatomic oxygen under the high process temperature, the second silicon nitride based layer 224 and the first silicon nitride based layer 220 are re-oxidized by the monatomic oxygen, such that the second silicon nitride based layer 224 and the first silicon nitride based layer 220 are converted into silicon oxide layers. While the second silicon nitride based layer 224 and the first silicon nitride based layer 220 are converted into the silicon oxide layers, the silicon oxide layers are integrated with the lining oxide layer 222 on the top surface 214 and the first side surface 216 of each semiconductor fin 206 to form the gate oxide layer 230.

In accordance with an embodiment, the present disclosure discloses a semiconductor device. The semiconductor device includes a semiconductor fin, a first silicon nitride based layer, a lining oxide layer, a second silicon nitride based layer and a gate oxide layer. The semiconductor fin has a top surface, a first side surface adjacent to the top surface, and a second side surface which is disposed under and adjacent to the first side surface. The first silicon nitride based layer peripherally encloses the second side surface of the semiconductor fin. The lining oxide layer is disposed conformal to the first silicon nitride based layer. The second silicon nitride based layer is disposed conformal to the lining oxide layer. The gate oxide layer is disposed conformal to the top surface and the first side surface of the semiconductor fin.

In accordance with another embodiment, the present disclosure discloses a method for manufacturing a semiconductor device. In this method, a semiconductor substrate is recessed to form various isolation regions in the semiconductor substrate and at least one semiconductor fin between the isolation regions and over top surfaces of the isolation regions. The at least one semiconductor fin has a top surface, a first side surface adjacent to the top surface, and a second side surface which is formed under and adjacent to the first side surface. A first silicon nitride based layer is formed conformal to the semiconductor fin. A lining oxide layer is formed conformal to the first silicon nitride based layer of the semiconductor fin. A second silicon nitride based layer is formed conformal to the lining oxide layer. Various trench isolation structures are formed on the isolation regions to peripherally enclose the second silicon nitride based layer on the second side surface of the semiconductor fin. The first silicon nitride based layer and the second silicon nitride based layer on the top surface and the first side surface are converted into a gate oxide layer.

In accordance with yet another embodiment, the present disclosure discloses a method for manufacturing a semiconductor device. In this method, a semiconductor substrate is recessed to form various isolation regions in the semiconductor substrate and at least one semiconductor fin between the isolation regions and over top surfaces of the isolation regions. A lining oxide layer is formed conformal to the semiconductor fin. A first silicon nitride based layer is formed conformal to the semiconductor fin and between the semiconductor fin and the lining oxide layer. A second silicon nitride based layer is formed conformal to the lining oxide layer. An isolation layer is formed to cover the second silicon nitride based layer and to fill the isolation regions. An anneal operation is performed on the isolation layer. The isolation layer is planarized to expose the second silicon nitride based layer on a top surface of the semiconductor fin. The isolation layer is recessed to form various trench isolation structures on the isolation regions. The operation of recessing the isolation layer includes exposing the second silicon nitride based layer on a first side surface of the semiconductor fin and forming the trench isolation structures to peripherally enclose the second silicon nitride based layer on a second side surface of the semiconductor fin. The first side surface is formed adjacent to the top surface of the semiconductor fin, and the second side surface is formed under and adjacent to the first side surface. The first silicon nitride based layer and the second silicon nitride based layer on the top surface and the first side surface are converted into a gate oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor fin having a top surface, a first side surface adjacent to the top surface, and a second side surface which is disposed under and adjacent to the first side surface;
   a first silicon nitride based layer peripherally enclosing the second side surface;
   a lining oxide layer disposed conformal to the first silicon nitride based layer;
   a second silicon nitride based layer disposed conformal to the lining oxide layer; and
   a gate oxide layer disposed conformal to the top surface and the first side surface.

2. The semiconductor device of claim 1, further comprising a plurality of trench isolation structures peripherally enclosing the second silicon nitride based layer.

3. The semiconductor device of claim 1, wherein the first silicon nitride based layer comprises a silicon nitride layer or a silicon oxynitride layer.

4. The semiconductor device of claim 1, wherein the first silicon nitride based layer has a nitrogen concentration ranging from 1E19 atoms/cm$^3$ to 5E21 atoms/cm$^3$.

5. The semiconductor device of claim 1, wherein the second silicon nitride based layer comprises a silicon nitride layer, a silicon oxynitride layer or a silicon oxycarbonitride layer.

6. The semiconductor device of claim 1, wherein the second silicon nitride based layer has a nitrogen concentration ranging from 1E19 atoms/cm$^3$ to 5E21 atoms/cm$^3$.

7. The semiconductor device of claim 1, wherein the gate oxide layer comprises a silicon oxide layer.

8. A method for forming a semiconductor device, comprising:
   recessing a semiconductor substrate to form a plurality of isolation regions in the semiconductor substrate and at least one semiconductor fin between the isolation regions and over top surfaces of the isolation regions, wherein the at least one semiconductor fin has a top surface, a first side surface adjacent to the top surface, and a second side surface which is formed under and adjacent to the first side surface;
   forming a first silicon nitride based layer conformal to the at least one semiconductor fin;
   forming a lining oxide layer conformal to the first silicon nitride based layer;
   forming a second silicon nitride based layer conformal to the lining oxide layer;
   forming a plurality of trench isolation structures on the isolation regions to peripherally enclose the second silicon nitride based layer on the second side surface; and
   converting the first silicon nitride based layer and the second silicon nitride based layer on the top surface and the first side surface into a gate oxide layer.

9. The method of claim 8, wherein the operation of forming the lining oxide layer is performed using a rapid thermal oxidation technique or an in-site steam generation technique.

10. The method of claim 8, wherein the operation of forming the lining oxide layer comprises forming the lining oxide layer having a thickness ranging from 20 angstrom to 60 angstrom.

11. The method of claim 8, wherein the operation of forming the lining oxide layer is performed before the operation of forming the first silicon nitride based layer, and the operation of forming the first silicon nitride based layer is performed using an anneal process, wherein the anneal process comprises:
  introducing a reaction gas into a process chamber, wherein the reaction gas comprises NO and/or $N_2O$; and
  controlling a process temperature of the process chamber between 900 degrees centigrade and 1050 degrees centigrade.

12. The method of claim 8, wherein the operation of forming the first silicon nitride based layer comprises forming the first silicon nitride based layer having a nitrogen concentration ranging from 1E19 atoms/$cm^3$ to 5E21 atoms/$cm^3$.

13. The method of claim 8, wherein the operation of forming the second silicon nitride based layer is performed after the operation of forming the first silicon nitride based layer and the operation of forming the lining oxide layer, and the operation of forming the second silicon nitride based layer is performed using an anneal process, wherein the anneal process comprises:
  introducing a reaction gas into a process chamber, wherein the reaction gas comprises $NH_3$; and
  controlling a process temperature of the process chamber between 900 degrees centigrade and 1050 degrees centigrade.

14. The method of claim 8, wherein the operation of forming the second silicon nitride based layer comprises forming the second silicon nitride based layer having a nitrogen concentration ranging from 1E19 atoms/$cm^3$ to 5E21 atoms/$cm^3$.

15. The method of claim 8, wherein
  the operation of forming the first silicon nitride based layer comprises forming the first silicon nitride based layer from silicon nitride or silicon oxynitride; and
  the operation of forming the second silicon nitride based layer comprises forming the second silicon nitride based layer from silicon nitride, silicon oxynitride or a silicon oxycarbonitride.

16. The method of claim 8, wherein the operation of converting the first silicon nitride based layer and the second silicon nitride based layer on the top surface and the first side surface into the gate oxide layer comprises:
  introducing a reaction gas into a process chamber, wherein the reaction gas comprises $O_2$ and 0.5 weight percent to 33 weight percent $H_2$; and
  controlling a process temperature of the process chamber between 500 degrees centigrade and 950 degrees centigrade;
  controlling a process pressure of the process chamber between 2 torr and 100 torr; and
  applying radio frequency electromagnetic energy at a microwave frequency to the process chamber.

17. A method for forming a semiconductor device, comprising:
  recessing a semiconductor substrate to form a plurality of isolation regions in the semiconductor substrate and at least one semiconductor fin between the isolation regions and over top surfaces of the isolation regions;
  forming a lining oxide layer conformal to the at least one semiconductor fin;
  forming a first silicon nitride based layer conformal to the at least one semiconductor fin and between the at least one semiconductor fin and the lining oxide layer;
  forming a second silicon nitride based layer conformal to the lining oxide layer;
  forming an isolation layer to cover the second silicon nitride based layer and to fill the isolation regions;
  performing an anneal operation on the isolation layer;
  planarizing the isolation layer to expose the second silicon nitride based layer on a top surface of the at least one semiconductor fin;
  recessing the isolation layer to form a plurality of trench isolation structures on the isolation regions, wherein the operation of recessing the isolation layer comprises exposing the second silicon nitride based layer on a first side surface of the at least one semiconductor fin and forming the trench isolation structures to peripherally enclose the second silicon nitride based layer on a second side surface of the at least one semiconductor fin, wherein the first side surface is formed adjacent to the top surface of the at least one semiconductor fin, and the second side surface is formed under and adjacent to the first side surface; and
  converting the first silicon nitride based layer and the second silicon nitride based layer on the top surface and the first side surface into a gate oxide layer.

18. The method of claim 17, wherein the operation of forming the lining oxide layer is performed before the operation of forming the first silicon nitride based layer, and the operation of forming the first silicon nitride based layer is performed using an anneal process, wherein the anneal process comprises:
  introducing a reaction gas into a process chamber, wherein the reaction gas comprises NO and/or $N_2O$; and
  controlling a process temperature of the process chamber between 900 degrees centigrade and 1050 degrees centigrade.

19. The method of claim 17, wherein the operation of forming the second silicon nitride based layer is performed after the operation of forming the lining oxide layer and the operation of forming the first silicon nitride based layer, and the operation of forming the second silicon nitride based layer is performed using an anneal process, wherein the anneal process comprises:
  introducing a reaction gas into a process chamber, wherein the reaction gas comprises $NH_3$; and
  controlling a process temperature of the process chamber between 900 degrees centigrade and 1050 degrees centigrade.

20. The method of claim 17, wherein the operation of converting the first silicon nitride based layer and the second silicon nitride based layer on the top surface and the first side surface into the gate oxide layer comprises:
  introducing a reaction gas into a process chamber, wherein the reaction gas comprises $O_2$ and 0.5 weight percent to 33 weight percent $H_2$; and
  controlling a process temperature of the process chamber between 500 degrees centigrade and 950 degrees centigrade;
  controlling a process pressure of the process chamber between 2 torr and 100 torr; and
  applying radio frequency electromagnetic energy at a microwave frequency to the process chamber.

* * * * *